(12) United States Patent
You et al.

(10) Patent No.: US 11,609,257 B2
(45) Date of Patent: Mar. 21, 2023

(54) EXPERIMENTAL DEVICE AND METHOD FOR TRIPPING PROPERTIES OF HIGH-VOLTAGE TRANSMISSION LINE IN SMOLDERING ATMOSPHERE

(71) Applicant: Nanjing Tech University, Jiangsu (CN)

(72) Inventors: Fei You, Jiangsu (CN); Zhiliang Xu, Jiangsu (CN); Sheng Wang, Jiangsu (CN); Zhenhua Wang, Jiangsu (CN); Kai Shui, Jiangsu (CN); Yaopeng Zhao, Jiangsu (CN); Siyi Chen, Jiangsu (CN)

(73) Assignee: Nanjing Tech University, Jiangsu (CN)

( * ) Notice: Subject to any disclaimer, the term of this patent is extended or adjusted under 35 U.S.C. 154(b) by 0 days.

(21) Appl. No.: 17/679,986

(22) Filed: Feb. 24, 2022

(65) Prior Publication Data

US 2022/0291272 A1 Sep. 15, 2022

(30) Foreign Application Priority Data

Mar. 11, 2021 (CN) .......................... 202110266850.6

(51) Int. Cl.
*G01R 27/04* (2006.01)
*G01R 31/00* (2006.01)
*G01R 31/12* (2020.01)

(52) U.S. Cl.
CPC ....... *G01R 31/003* (2013.01); *G01R 31/1209* (2013.01); *G01R 31/1218* (2013.01)

(58) Field of Classification Search
CPC .... G01R 31/003; G01R 31/08; G01R 31/042; G01R 31/1218; G01R 31/1209
See application file for complete search history.

(56) References Cited

U.S. PATENT DOCUMENTS

| 5,185,684 A * | 2/1993 | Beihoff ............... G01R 15/181 361/87 |
| 2014/0270205 A1* | 9/2014 | Miller .................... G01R 31/14 381/58 |
| 2021/0148735 A1* | 5/2021 | Jiang .................. G01D 5/35325 |
| 2022/0221499 A1* | 7/2022 | Cho ....................... G01R 31/58 |

\* cited by examiner

*Primary Examiner* — Thang X Le
(74) *Attorney, Agent, or Firm* — Lee & Hayes, P.C.

(57) ABSTRACT

An experimental device for tripping properties of a high-voltage transmission line in a smoldering atmosphere, including a central information processor, a biomass fuel (BMF) property characterization module, a smoldering generation module, a smoldering smoke field property test module, a power frequency supply module and a tripping property test module. The experimental device and method for tripping properties of a high-voltage transmission line in a smoldering atmosphere, the present disclosure can explore the development conditions, processes, modes, properties and mechanisms of discharge in the smoldering atmosphere, and fully characterize the BMF such as forest vegetations from multiple aspects, to reproduce properties of forest vegetations in corridor areas of the high-voltage transmission line in multiple working conditions and reflect influences of properties of ground forest vegetations on the tripping properties of the high-voltage transmission lines.

5 Claims, 3 Drawing Sheets

EXPERIMENTAL DEVICE AND METHOD FOR TRIPPING PROPERTIES OF HIGH-VOLTAGE TRANSMISSION LINE IN SMOLDERING ATMOSPHERE

CROSS REFERENCE TO RELATED APPLICATIONS

This patent application claims the benefit and priority of Chinese Patent Application No. 202110266850.6, filed on Mar. 11, 2021, the disclosure of which is incorporated by reference herein in its entirety as part of the present application.

TECHNICAL FIELD

The present disclosure relates to the field of simulations and characteristic measurements of wildfire-induced tripping processes of high-voltage transmission lines, and in particular, to an experimental device and method for tripping properties of a high-voltage transmission line in a smoldering atmosphere.

BACKGROUND ART

Generally, air is a good insulator. According to the Standard Edition of the Regulations on Electrical Safety Management (RHD-QB-K3433), to ensure the electrical safety, enough air gaps are required to be kept between high-voltage transmission lines and the ground, and between one phase and another conductor. However, the temperature of hot smoke from wildfires can exceed 800° C. In addition, smoldering of biomass fuels (BMFs) in virgin and plantation lands often generates a large amount of dense smoke and ash. In view of these facts, under the action of environmental factors such as air velocity, mountain slope and ambient humidity, the insulating strengths of air gaps for the transmission lines will be reduced significantly, which causes the lines to trip easily with a low reclosure success rate. Therefore, the accidents arising from the wildfires have the properties of high outbreak frequency, long duration, widespread range, and difficult restoration.

SUMMARY

Some objectives of the present disclosure are: to provide an experimental device and method for tripping properties of a high-voltage transmission line in a smoldering atmosphere, to measure the change rule of tripping voltages of the high-voltage transmission line in the smoke atmosphere, and to explore the development conditions, processes, modes, properties, and mechanisms of discharges in the smoldering atmosphere.

To achieve the above-mentioned objectives, the present disclosure provides an experimental device for tripping properties of a high-voltage transmission line in a smoldering atmosphere, including a central information processor, a BMF property characterization module, a smoldering generation module, a smoldering smoke field property test module, a power frequency supply module and a tripping property test module.

The BMF property characterization module includes: a high-precision electronic balance, a BMF moisture meter, a high-precision porosity and density tester, a three-dimensional (3D) large-stroke surface contour scanner, a Fourier-transform infrared (FTIR) spectrometer, and an X-ray diffractometer.

The smoldering generation module includes: a smoldering container, a flat electrical-heating plate, an operating table, and a conductor wire.

The smoldering smoke field property test module includes: a smoke-accumulating collection plate, a smoke-collecting analyzer, a high-speed camera, a high-resolution camera, an electrode-conductivity tester, an optical smoke density detector, an infrared thermal imager, a thermocouple tree, a probing smoke moisture analyzer, a Ringelman smoke opacity meter, a smoke-dust particulate concentration tester, a heat flow meter, a schlieren apparatus, an atmospheric conductivity Gerdien probe, and an intelligent resistance tester.

The power frequency supply module and the tripping property test module each include a booster transformer, a physical oscilloscope, a high-voltage power supply (HVPS) device, a digital audio collector, and a point discharge portion.

Preferably, the smoldering container may be a cuboid container and opened on the top surface; a quartz plate may serve as a bottom surface of the smoldering container; the flat electrical-heating plate may be provided on a sidewall and the bottom surface of the smoldering container, respectively; the flat electrical-heating plate on the bottom surface may be flush with the quartz plate; an edge of the smoldering container may be wrapped by a steel material; and the smoldering container may be provided on the high-precision electronic balance.

A plurality of probe holes may be formed on the sidewall of the smoldering container; thermocouples may be provided in the probe holes, respectively; the infrared thermal imager, the thermocouple tree, the heat flow meter and the schlieren apparatus may be arranged outside the smoldering container; the thermocouple tree may be composed of a plurality of thermocouples; the thermocouples may be fixed on a steel frame; and the steel frame may be provided outside the smoldering container.

A top end of the smoldering container may be provided with the smoke-accumulating collection plate; the smoke-accumulating collection plate and the sidewall of the smoldering container may be made of a transparent fireproof glass material; a periphery of the smoke-accumulating collection plate may be fixedly connected with the smoldering container through an insulating fireproof glue; a vent hole may be formed in the middle of a top of the smoke-accumulating collection plate; and a probe of the smoke-collecting analyzer may be provided in the vent hole.

Preferably, the conductor wire may be provided above the smoke-accumulating collection plate; the conductor wire may be made of an aluminum conductor steel reinforced (ACSR) strand; the optical smoke density detector, the smoke-dust particulate concentration tester, the electrode-conductivity tester, the Ringelman smoke opacity meter and the probing smoke moisture analyzer may be arranged on the conductor wire; the smoke-dust particulate concentration tester may be opposite to the vent hole; the optical smoke density detector may be sleeved on a surface of the conductor wire; and the point discharge portion may be provided above the conductor wire.

Preferably, the central information processor may be electrically connected with the intelligent resistance tester, the physical oscilloscope, and the high-precision electronic balance, respectively; the intelligent resistance tester may be connected with the conductor wire in parallel; the physical oscilloscope may be electrically connected with one end of the conductor wire; the other end of the conductor wire may be electrically connected with the HVPS device; the HVPS device may be electrically connected with the operating table; and the operating table may be electrically connected with the booster transformer.

An experimental method for tripping properties of a high-voltage transmission line in a smoldering atmosphere includes the following operating steps:

S1: adding a BMF to a smoldering container, testing a moisture content of the BMF through a BMF moisture meter, and testing a porosity and a density of the BMF through a high-precision porosity and density tester;

S2: turning on a flat electrical-heating plate to heat the BMF, measuring a spatial smoke temperature with a thermocouple tree, turning on a high-precision electronic balance in a whole process to measure a mass change of the BMF during smoldering, and turning on a 3D large-stroke surface contour scanner in the whole process to measure a macroscopic morphology of the BMF;

S3: gathering continuously rising smoldering smoke together through a smoke-accumulating collection plate, collecting the smoldering smoke with an aluminum foil smoke collection bag, turning on a smoke-collecting analyzer, a high-speed camera, a high-resolution camera, an electrode-conductivity tester, an optical smoke density detector, a probing smoke moisture analyzer, a Ringelman smoke opacity meter, a smoke-dust particulate concentration tester, a heat flow meter, a schlieren apparatus, an atmospheric conductivity Gerdien probe and an intelligent resistance tester in the whole experimental process, and acquiring and analyzing characteristic parameters of a smoke field, including a composition, a form, a morphology, a phase state, a density, a temperature, a humidity, a chromaticity, a particle, a flow field, a heat amount and a conductivity of the smoke;

S4: turning on a power supply and removing the smoke-accumulating collection plate, the power supply being turned on when the smoke rises to a conductor wire, controlling a voltage and a frequency of the conductor wire through an operating table, starting a point discharge experiment, and recording and analyzing the tripping properties, including point discharge time, a line breakdown voltage, a leakage current, a fault recording waveform and an arc breakdown audio frequency;

S5: respectively turning on an MIR spectrometer and an X-ray diffractometer before and after the smoldering to measure a chemical composition and an inorganic impurity of the BMF; and S6: respectively adding the BMF having a different morphology and amount to the smoldering container for a repeated experiment.

Therefore, the experimental device and method for testing tripping properties of a high-voltage transmission line in a smoldering atmosphere provided by the present disclosure achieve the following beneficial effects:

1) With the 30 kVA/50 kV light-weight high-voltage test transformer, voltage regulator, resistance-capacitance (RC) voltage divider and simulation electrode or the high-voltage transmission line segment, physical oscilloscope and digital audio collector, etc., the disclosed experimental device and method can reproduce the alternating-current (AC) high-voltage power frequency electric field and the direct-current (DC) high-voltage electric field to test the tripping properties, and capture the audio frequency features of the air breakdown induced by an arc. In the simulation experiments, the uniform voltage boosting method or uniform voltage withstanding method is used to measure the tripping properties in different smoke atmospheres.

2) The disclosed experimental device and method can fully characterize the mass, moisture content, porosity, bulk density, macroscopic morphology, chemical composition, inorganic impurity and so on of the BMF such as the forest vegetation before the tripping test. In this case, properties of forest vegetation in corridor areas below the high-voltage transmission lines under multiple working conditions can be reproduced, and influences of properties of ground forest vegetation on the tripping properties of the high-voltage transmission lines can be reflected.

3) The disclosed experimental device and method can comprehensively and fully characterize the composition, form, morphology, phase state, density, temperature, humidity, chromaticity, particle, flow field, heat amount, conductivity and so on of the smoke produced by smoldering of the BMF such as the forest vegetation. Hereby, influencing mechanisms and weighing effects of single smoke factors besides integrated fire sources on the tripping properties of the high-voltage transmission line under multiple working conditions can be clearly figured out.

4) By measuring, recording and analyzing various performance indicators such as the breakdown distance, breakdown voltage, leakage current, fault recording waveform (pulse period and pulse frequency), arc formation trajectory, smoke motion trajectory and arc breakdown audio frequency of the transmission line in different smoke atmospheres, the disclosed experimental device and method can record and analyze the data in the breakdown processes of the transmission lines perfectly with various attached devices.

The technical solutions of the disclosed experimental device and method will be further described in detail below with reference to accompanying drawings and embodiments.

Figure 1:
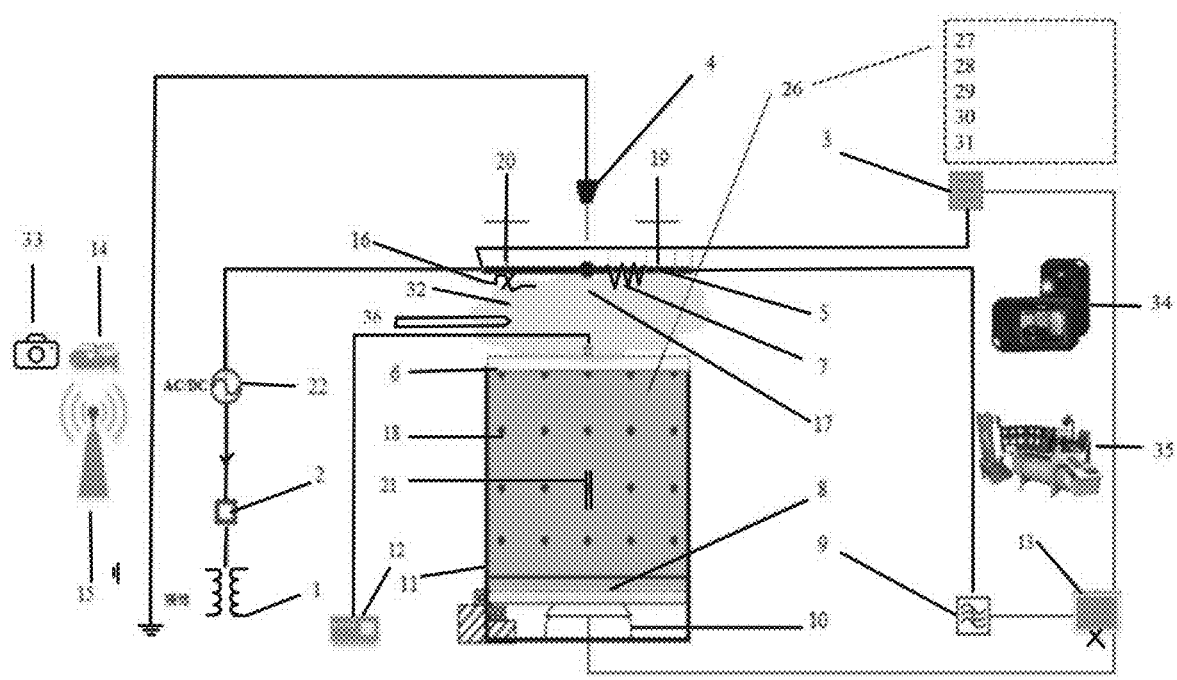
FIG. 1 illustrates a schematic structural view of an experimental device for tripping properties of a high-voltage transmission line in a smoldering atmosphere according to an embodiment of the present disclosure.
Figure 2:
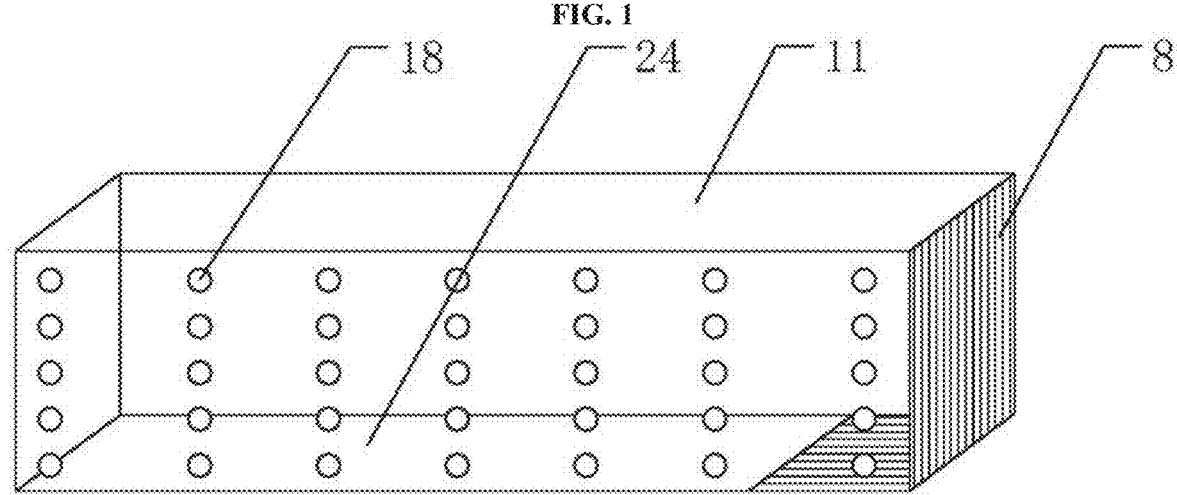
FIG. 2 illustrates a schematic structural view of a smoldering container according to an embodiment of the present disclosure.

REFERENCE NUMERALS 1. booster transformer, 2. operating table, 3. intelligent resistance tester, 4. point discharge portion, 5. conductor wire, 6. smoke-accumulating collection plate, 7. optical smoke density detector, 8. flat electrical-heating plate, 9. physical oscilloscope, 10. high-precision electronic balance, 11. smoldering container, 12. smoke-collecting analyzer, 13. central information processor, 14. high-speed camera, 15. digital audio collector, 16. electrode-conductivity tester, 17. smoke-dust particulate concentration tester, 18. thermocouple, 19. probing smoke moisture analyzer, 20. Ringelman smoke opacity meter, 21. heat flow meter, 22. HVPS device, 23. steel frame, 24. quartz plate, 25. probe hole, 26. BMF, 27. BMF moisture meter, 28. high-precision porosity and density tester, 29. 3D large-stroke surface contour scanner, 30. FTIR spectrometer, 31. X-ray diffractometer, 32. smoldering smoke, 33. high-resolution camera, 34. infrared thermal imager, 35. schlieren apparatus, and 36. atmospheric conductivity Gerdien probe.

DETAILED DESCRIPTION OF THE EMBODIMENTS

The technical solutions of the present disclosure will be further described below with reference to the accompanying drawings and examples.

Unless otherwise defined, the technical or scientific terms used herein should have the usual meanings understood by a person of ordinary skill in the field to which the present disclosure belongs. Terms such as "first" and "second" used herein do not denote any order, quantity or importance, but are merely intended to distinguish between different constituents. "Comprising", "containing", and similar words mean that elements or articles appearing before "comprising" or "containing" include the elements or articles and their equivalent elements appearing behind "comprising" or "containing", not excluding any other elements or articles. "Connected", "connected with each other" and similar words are not restricted to physical or mechanical connections, but may include direct and indirect electrical connections. "Upper", "lower", "left", "right", and the like are used only to indicate a relative positional relationship, and when the absolute position of the described object is changed, the relative positional relationship is also changed accordingly.

As shown in the figures, an experimental device for tripping properties of a high-voltage transmission line in a smoldering atmosphere includes a central information processor 13, a BMF property characterization module, a smoldering generation module, a smoldering smoke field property test module, a power frequency supply module and a tripping property test module. According to the technical solutions, the present disclosure can simulate smoke atmospheres generated by smoldering of different BMFs 26, and measure the change rule for tripping voltages of the high-voltage transmission line. By monitoring and identifying the characteristic change of the BMF 26 in the whole process, recording the discharge breakdown phenomenon of the high-voltage transmission line, collecting and analyzing the compositions and physicochemical properties of the smoke, analyzing the heat flow density and motion trajectory recorded by the schlieren apparatus 35 for the smoldering smoke 32, measuring resistivities of the conductor wire 5 and smoldering smoke 32 with the atmospheric conductivity Gerdien probe 36 and intelligent resistance tester 3, and analyzing the insulativity change in the dynamic smoldering smoke 32 and influences of the smoldering smoke 32 on the resistance of the conductor wire 5, the disclosed experimental device and method determines influences of different smoke compositions on the tripping rule of the high-voltage transmission line, and influences of the change of the smoke density measured by the optical smoke density detector 7 on the tripping rule of the high-voltage transmission line, to explore the development conditions, processes, modes, properties and mechanisms for breakdown and discharge of the air in the smoldering smoke 32 of the BMF 26 in virgin woodlands.

The BMF property characterization module is configured to describe properties of smoldering substances, and simulate complex natural environments in mountain fires. The BMF 26 herein is generally formed by tuberous sword fern, eucalyptus leaves, eucalyptus wood chips, aspen wood chips and mixtures thereof. The BMF property characterization module includes: a high-precision electronic balance 10, provided below a smoldering container 11, including a tabletop with a size of 230×300 mm, having a precision of 0.1 g, and configured to record and store a weight of the smoldering container 11 in real time; a BMF moisture meter 27, configured to measure a moisture content; a high-precision porosity and density tester 28, configured to measure a porosity and a bulk density of the BMF 26; a 3D large-stroke surface contour scanner 29, configured to measure a macroscopic morphology; an FTIR spectrometer 30, configured to measure a chemical composition; and an X-ray diffractometer 31, configured to measure an inorganic impurity.

The smoldering generation module is configured to simulate generation of smoldering smoke 32, and includes: a smoldering container 11, configured to provide a smoldering environment for the BMF 26, for ease of generation and collection of the smoke; a flat electrical-heating plate 8, configured to provide a stable heating source for the BMF 26; an operating table 2, configured to provide voltages of different frequencies for a conductor; and a conductor wire 5, which is an ACSR strand, and configured to simulate the high-voltage transmission line.

The smoldering smoke field property test module includes: a smoke-accumulating collection plate 6, configured to collect the smoke; a smoke-collecting analyzer 12, configured to analyze a composition of the collected smoldering smoke 32; a high-speed camera 14, configured to record a whole transient breakdown process of point discharge; a high-resolution camera 33, configured to record a macroscopic morphology of the smoke; an electrode-conductivity tester 16, configured to measure a phase state of a current of the conductor wire 5; an optical smoke density detector 7, configured to measure a density of the smoke; an infrared thermal imager 34 and a thermocouple tree, configured to measure a temperature of the smoke; a probing smoke moisture analyzer 19, configured to measure a humidity of the smoke; a Ringelman smoke opacity meter 20, configured to measure a chromaticity of the smoke; a smoke-dust particulate concentration tester 17, configured to measure a particulate concentration of smoke and dust generated by the BMF 26; a heat flow meter 21 and a schlieren apparatus 35, configured to measure a heat flow density and a motion trajectory of the smoldering smoke 32 generated during smoldering; and an atmospheric conductivity Gerdien probe 36 and an intelligent resistance tester 3, configured to measure a resistivity of each of the conductor wire 5 and the smoldering smoke 32, analyze an insulativity change in the dynamic smoldering smoke 32 and an influence of the smoldering smoke 32 on a resistance of the conductor wire 5.

The power frequency supply module and the tripping property test module each include: a booster transformer 1, configured to change a current and a voltage passing through the conductor wire 5; a physical oscilloscope 9, configured to measure a change of each of a voltage waveform and a current waveform in the whole point discharge process, including the breakdown voltage of the high-voltage transmission line, the leakage current, the fault recording waveform and other air breakdown properties; an HVPS device 22, configured to provide a 50 kV high-voltage industrial frequency AC power supply and a 50 kV high-voltage DC power supply; a digital audio collector 15, configured to acquire an audio frequency of the point discharge, where collected data are subsequently used to simulate the change of the discharge acoustic wave, and analyze point discharge rules in different smoldering atmospheres; and a point discharge portion 4, provided with a conical end and made of a pure copper material. The point discharge portion 4 may also be replaced by the cable to simulate "line-line discharge" or "line-point discharge".

Figure 3:
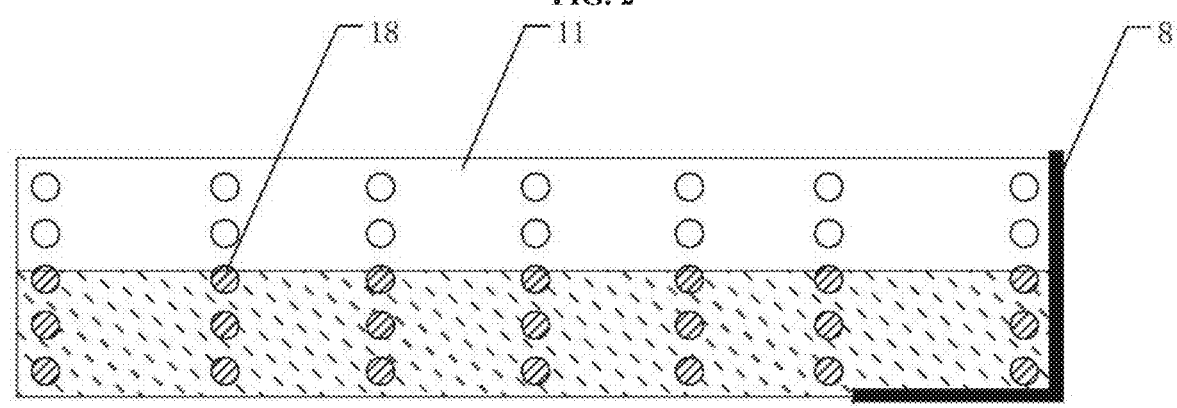
FIG. 3 illustrates a side view of a smoldering container in an experimental state according to an embodiment of the present disclosure.
Figure 4:
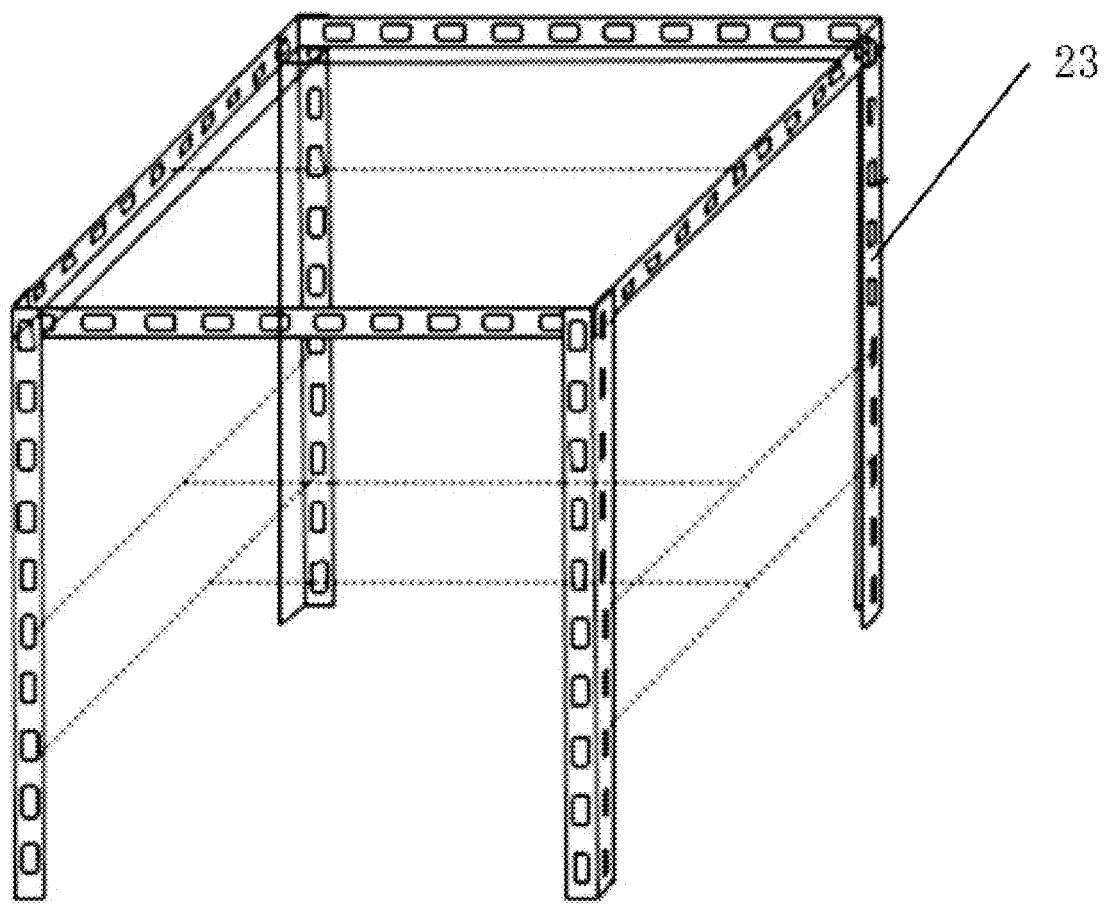
FIG. 4 illustrates a schematic structural view of a steel frame according to an embodiment of the present disclosure.
Figure 5:
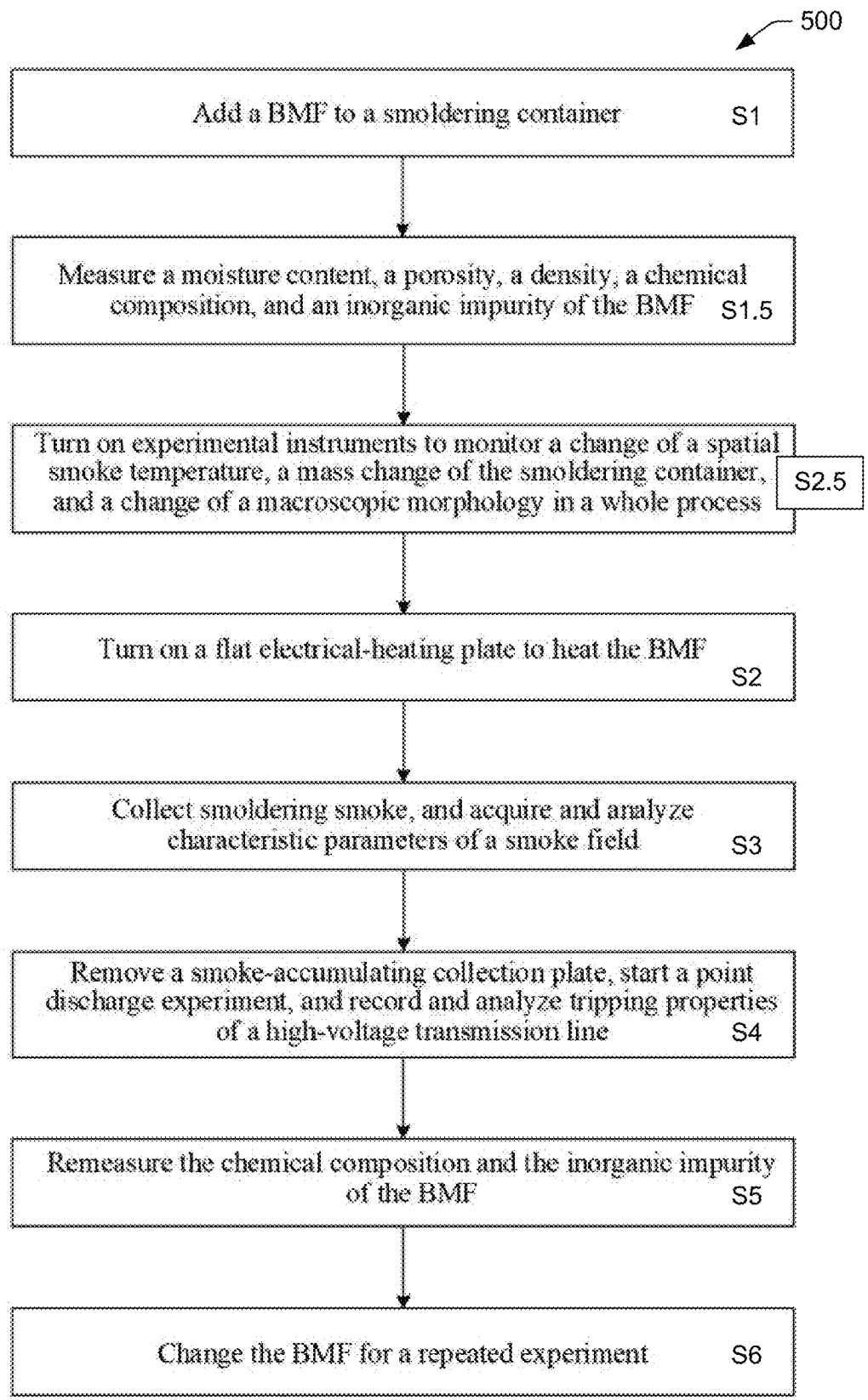
FIG. 5 illustrates a flow chart of an experiment according to the present disclosure.

The smoldering container 11 is a cuboid container and is opened on the top surface. The smoldering container 11 has dimensions of 50.00 cm×10.00 cm×10.00 cm. A quartz plate 24 serves as a bottom surface of the smoldering container 11, and an edge of the smoldering container 11 is wrapped by a steel material. The smoldering container 11 is provided on the high-precision electronic balance 10. The flat electrical-heating plate 8, of which the power is 5 kw and the heating surface has a size of 10.00 cm×10.00 cm, is provided on the bottom surface and a sidewall of the smoldering container 11, respectively. A plurality of probe holes 25 are formed on the sidewall of the smoldering container 11. Thermocouples 18 for measuring a smoldering temperature of the BMF 26 by inserting into the smoldering fuel are provided in the probe holes 25, respectively, as shown in FIG. 3. A top end of the smoldering container 11 is provided with the smoke-accumulating collection plate 6; the smoke-accumulating collection plate 6 and the sidewall of the smoldering container 11 are made of a transparent fireproof glass material; and a periphery of the smoke-accumulating collection plate 6 is fixedly connected with the smoldering container 11 through an insulating fireproof glue. A vent hole is formed in the middle of a top of the smoke-accumulating collection plate 6; and a probe of the smoke-collecting analyzer 12 is provided in the vent hole.

The infrared thermal imager 34, the thermocouple tree, the heat flow meter 21 and the schlieren apparatus 35 are arranged outside the smoldering container 11. The thermocouple tree is composed of a plurality of thermocouples 18; the thermocouples 18 are fixed on a steel frame 23; and the steel frame 23 is provided outside the smoldering container 11 and configured to measure the spatial temperature of the smoke. The steel frame 23 is detachable and made of a porous angle steel. The thermocouples 18 each are a K-type M8 thermocouple 18, with the shielded line being 150 cm long, the probe being 20 cm long and the temperature measurement range being 0-1300° C.

The conductor wire 5 is provided above the smoke-accumulating collection plate 6; the optical smoke density detector 7, the smoke-dust particulate concentration tester 17, the electrode-conductivity tester 16, the Ringelman smoke opacity meter 20 and the probing smoke moisture analyzer 19 are arranged on the conductor wire 5; the smoke-dust particulate concentration tester 17 is opposite to the vent hole; the optical smoke density detector 7 is sleeved on a surface of the conductor wire 5; and the point discharge portion 4 is provided above the conductor wire 5.

The central information processor 13 is electrically connected with the intelligent resistance tester 3, the physical oscilloscope 9, and the high-precision electronic balance 10, respectively. The central information processor 13 receives data acquired by each module, monitor the whole experimental process, and process experimental data. The intelligent resistance tester 3 is connected with the conductor wire 5 in parallel; the physical oscilloscope 9 is electrically connected with one end of the conductor wire 5; the other end of the conductor wire 5 is electrically connected with the HVPS device 22; the HVPS device 22 is electrically connected with the operating table 2; and the operating table 2 is electrically connected with the booster transformer 1.

An experimental method 500 for tripping properties of a high-voltage transmission line in a smoldering atmosphere includes the following operating steps:

S1: Add a BMF 26 to a smoldering container 11, where the tested fuel sample is formed by eucalyptus leaves, eucalyptus branches, tuberous sword fern, aspen wood chips and mixtures thereof, and the sample has a moisture content of about 10% and a particle size of 7-35 meshes; S1.5: test (measure) a moisture content of the BMF 26 through a BMF moisture meter 27; and test a porosity and a density of the BMF 26 through a high-precision porosity and density tester 28.

S2: Turn on a flat electrical-heating plate 8 to heat the BMF 26, where bottom and side flat electrical-heating plates 8 are turned on at the same time, and the BMF is heated from the room temperature to 400° C., and continuously heated to keep the temperature until 10,800 s; S2.5: measure a spatial smoke temperature with a thermocouple tree, turn on a high-precision electronic balance 10 (experimental instruments) in a whole process to measure a mass change of the BMF 26 during smoldering, and turn on a 3D large-stroke surface contour scanner 29 in the whole process to measure a macroscopic morphology of the BMF 26.

S3: Gather continuously rising smoldering smoke 32 together through a smoke-accumulating collection plate 6, collect the smoldering smoke 32 with an aluminum foil smoke collection bag, turn on a smoke-collecting analyzer 12, a high-speed camera 14, a high-resolution camera 33, an electrode-conductivity tester 16, an optical smoke density detector, a probing smoke moisture analyzer 19, a Ringelman smoke opacity meter 20, a smoke-dust particulate concentration tester 17, a heat flow meter 21, a schlieren apparatus 35, an atmospheric conductivity Gerdien probe 36 and an intelligent resistance tester 3 in the whole experiment process, and acquire and analyze characteristic parameters of a smoke field, including a composition, a form, a morphology, a phase state, a density, a temperature, a humidity, a chromaticity, a particle, a flow field, a heat amount and an conductivity of the smoke.

S4: Turn on a power supply and remove the smoke-accumulating collection plate 6, the power supply being turned on when the smoldering smoke 32 rises to a conductor wire 5, control a voltage and a frequency of the conductor wire 5 through an operating table 2, starting a point discharge experiment, and recording and analyzing the tripping properties, including point discharge time, a line breakdown voltage, a leakage current, a fault recording waveform and an arc breakdown audio frequency.

S5: Respectively turn on an FTIR spectrometer 30 and an X-ray diffractometer 31 before and after the smoldering to measure (remeasure) a chemical composition and an inorganic impurity of the BMF 26.

S6: Respectively add the BMF 26 having a different morphology and amounts to the smoldering container 11 for a repeated experiment.

Example 1

The uniform voltage boosting method is used to measure breakdown voltages in different smoke atmospheres at a fixed distance, with the following operating steps:

1) Smoldering: all devices were connected; the prepared smoldering fuel was added to the smoldering container 11; the flat electrical-heating plate 8 was turned on to gradually heat the smoldering container until the smoldering raw material inside generated the smoldering smoke 32; and in the whole process, the smoldering container 11 was airtight and kept the internal temperature constant, so as to transfer heat stably.

2) Turn-on of the power supply: after the whole discharge electrode combination was surrounded by the smoldering smoke 32, the voltage booster was turned on to gradually boost the voltage, the transformer was used to control the boosting rate, and the voltage was boosted slowly until a breakdown occurred; in case of no breakdown, the voltage was continuously boosted until there were the breakdown and a low-frequency corona with light and sound; and meanwhile, the voltage value in point discharge was observed through the operating table 2, the digital audio collector 15 was used to acquire acoustic information, and the high-speed camera 14 was used to record corona discharge information. The breakdown test was conducted for 3-5 times in the same conditions, and the minimum discharge voltage was selected as the breakdown voltage.

3) Temperature and smoke collection: while the flat electrical-heating plate 8 was turned on for heating, the temperature in the smoldering container 11 rose gradually; in this case, thermocouples 18 in the container could measure the spatial smoke temperature, and the measured temperature data were collected by the temperature collector and input to the data acquisition and processing device for storage; and the smoldering smoke continuously rose, the smoke-accumulating collection plate 6 was used to gather the smoldering smoke 32 together, and the smoke-collecting analyzer 12 was used to collect the smoke and analyze physicochemical properties of the smoldering smoke 32.

4) Collection on mass change of the fuel: in the whole smoldering process, the high-precision electronic balance 10 was used to record and store the weight of the smoldering container 11 in real time, thus drawing a mass loss curve of the fuel; and the mass loss curve of the fuel was analyzed by comparing with the power of the corresponding fire source on the flat electrical-heating plate 8.

5) Acquisition and analysis of electrical properties: the physical oscilloscope 9 was used to record such air breakdown properties as the breakdown voltage, leakage current and fault recording (current) waveform; information such as the pulse period, pulse frequency, arc pulse (mA) and stable leakage current (mA) was extracted from the receiving-end A/B/C phase current waveform and the sending-end A/B/C phase fault waveform; relations between parameters such as the average breakdown field strength and fault waveform and parameters such as the spark gap, temperature of the smoldering smoke 32, heat flow density of the smoldering smoke 32, and power of the flat electrical-heating plate 8 were analyzed, and breakdown and discharge properties of the high-voltage transmission line in different smoke atmospheres were deduced and simulated.

6) Image acquisition and analysis: the high-speed camera 14 was used to record the shape/contour/height/luminance of the corona in discharge as well as the formation process and trajectory of the arc in discharge, and the image was used to analyze the combustion state of the fire source and research the formation mechanism of the arc; the schlieren apparatus 35 was used to track and record the trajectory of the heat flow of the smoldering smoke 32, and through the image of the schlieren apparatus, the manner of filling the upper space of the smoldering container 11 and the effect on the conductor wire 5 were determined, the influences of the heat flow caused by the smoldering smoke 32 on insulativity of the air was explored, and the formation mechanism of the arc was analyzed.

7) Acquisition and analysis of the discharge acoustic wave: the audio frequency in point discharge was acquired by the digital audio collector 15, and the acquired audio data could be subsequently used for simulating the change of the discharge acoustic wave, thus researching and analyzing the point discharge rules in different smoldering atmospheres.

8) Repeated test: upon the completion of the test, the electrode combination was changed or the power of the flat electrical-heating plate 8 was adjusted to repeat the above experiment.

Example 2

The uniform voltage withstanding method is used to measure breakdown distances in different smoke atmospheres at a fixed voltage, with the following operating steps:

1) Smoldering: all devices were connected; the prepared smoldering fuel was added to the smoldering container 11; the flat electrical-heating plate 8 was turned on to gradually heat the smoldering container until the smoldering raw material inside generated the smoldering smoke 32; and in the whole process, the smoldering container 11 was airtight and kept the internal temperature constant, so as to transfer heat stably.

2) Turn-on of the power supply: when the conductor wire 5 was fully surrounded by the smoldering smoke 32 under continuous heating of the flat electrical-heating plate 8, an appropriate voltage (30 kV) was selected and applied; and in the whole experimental process, the voltage was kept unchanged.

3) Adjustment on two electrodes: the conductor was lifted from a lowest adjustable place, with unchanged positions with point electrodes; when there was an obvious low-frequency corona discharge sound such as "squeaking" between the two electrodes, lifting speeds of the conductor and the electrodes were slowed and the voltage withstanding method was used, namely whenever the conductor and the electrodes were lifted once, the voltage was withstood for 1 min; in case of no breakdown, the conductor and the electrodes were lifted slightly until the breakdown occurred; and the breakdown test was conducted for 3-5 times in the same conditions, and the minimum electrode distance was selected as the breakdown distance.

4) Temperature and smoke collection: while the flat electrical-heating plate 8 was turned on for heating, the temperature in the smoldering container 11 rose gradually; in this case, thermocouples 18 in the container could measure the spatial smoke temperature, and the measured temperature data were collected by the temperature collector and input to the data acquisition and processing device for storage; and the smoldering smoke 32 continuously rose, the smoke-accumulating collection plate 6 was used to gather the smoldering smoke 32 together, and the smoke-collecting analyzer 12 was used to collect the smoke and analyze physicochemical properties of the smoldering smoke 32.

5) Collection on mass change of the fuel: in the whole smoldering process, the electronic balance was used to record and store the weight of the fire source generation module in real time, thus drawing a mass loss curve of the fuel; and the mass loss curve of the fuel was analyzed by comparing with the power of the corresponding fire source on the flat electrical-heating plate 8 to discover the inherent law.

6) Acquisition and analysis of electrical properties: the physical oscilloscope 9 was used to record such air breakdown properties as the breakdown voltage, leakage current and fault recording (current) waveform; information such as the pulse period, pulse frequency, arc pulse (mA) and stable leakage current (mA) was extracted from the receiving-end A/B/C phase current waveform and the sending-end A/B/C phase fault waveform; relations between parameters such as the average breakdown field strength and fault waveform and parameters such as the spark gap, temperature of the smoldering smoke 32, heat flow density of the smoldering smoke 32, and power of the flat electrical-heating plate 8 were analyzed, and breakdown and discharge properties of the high-voltage transmission line in different smoke atmospheres were deduced and simulated.

7) Image acquisition and analysis: the high-speed camera 14 was used to record the shape/contour/height/luminance of the corona in discharge as well as the formation process and trajectory of the arc in discharge, and the image was used to analyze the combustion state of the fire source and research the formation mechanism of the arc; the schlieren apparatus 35 was used to track and record the trajectory of the heat flow of the smoldering smoke 32, and through the image of the schlieren apparatus, the manner of filling the upper space of the smoldering container 11 and the effect on the conductor wire 5 were determined, the influences of the heat flow caused by the smoldering smoke 32 on insulativity of the air was explored, and the formation mechanism of the arc was analyzed.

8) Acquisition and analysis of the discharge acoustic wave: the audio frequency in point discharge was acquired by the digital audio collector 15, and the acquired audio data could be subsequently used for simulating the change of the discharge acoustic wave, thus researching and analyzing the point discharge rules in different smoldering atmospheres.

9) Repeated test: upon the completion of the test, the electrode combination was changed or the power of the flat electrical-heating plate 8 was adjusted to repeat the above experiment.

Therefore, the experimental device and method for testing tripping properties of a high-voltage transmission line in a smoldering atmosphere provided by the present disclosure achieve the following beneficial effects:

1) With the 30 kVA/50 kV light-weight high-voltage test transformer, voltage regulator, resistance-capacitance (RC) voltage divider and simulation electrode or the high-voltage transmission line segment, physical oscilloscope and digital audio collector, etc., the disclosed experimental device and method can reproduce the alternating-current (AC) high-voltage power frequency electric field and the direct-current (DC) high-voltage electric field to test the tripping properties, and capture the audio frequency features of the air breakdown induced by an arc. In the simulation experiments, the uniform voltage boosting method or uniform voltage withstanding method is used to measure the tripping properties in different smoke atmospheres.

2) The disclosed experimental device and method can fully characterize the mass, moisture content, porosity, bulk density, macroscopic morphology, chemical composition, inorganic impurity and so on of the BMF such as the forest vegetation before the tripping test. In this case, properties of forest vegetation in corridor areas below the high-voltage transmission lines under multiple working conditions can be reproduced, and influences of properties of ground forest vegetation on the tripping properties of the high-voltage transmission lines can be reflected.

3) The disclosed experimental device and method can comprehensively and fully characterize the composition, form, morphology, phase state, density, temperature, humidity, chromaticity, particle, flow field, heat amount, conductivity and so on of the smoke produced by smoldering of the BMF such as the forest vegetation. Hereby, influencing mechanisms and weighing effects of single smoke factors besides integrated fire sources on the tripping properties of the high-voltage transmission line under multiple working conditions can be clearly figure out.

4) By measuring, recording and analyzing various performance indicators such as the breakdown distance, breakdown voltage, leakage current, fault recording waveform (pulse period and pulse frequency), arc formation trajectory, smoke motion trajectory and arc breakdown audio frequency of the transmission line in different smoke atmospheres, the disclosed experimental device and method can record and analyze the data in the breakdown processes of the transmission lines perfectly with various attached devices.

What is claimed is:

1. An experimental device for tripping properties of a high-voltage transmission line in a smoldering atmosphere, comprising:
    a central information processor;
    a biomass fuel (BMF) property characterization module;
    a smoldering generation module;
    a smoldering smoke field property test module;
    a power frequency supply module; and
    a tripping property test module,
    wherein:
        the BMF property characterization module comprises: a high-precision electronic balance, a BMF moisture meter, a high-precision porosity and density tester, a three-dimensional (3D) large-stroke surface contour scanner, a Fourier-transform infrared (FTIR) spectrometer, and an X-ray diffractometer (XRD);
        the smoldering generation module comprises: a smoldering container, a flat electrical-heating plate, an operating table, and a conductor wire;
        the smoldering smoke field property test module comprises: a smoke-accumulating collection plate, a smoke-collecting analyzer, a high-speed camera, a high-resolution camera, an electrode-conductivity tester, an optical smoke density detector, an infrared thermal imager, a thermocouple tree, a probing smoke moisture analyzer, a Ringelman smoke opacity meter, a smoke-dust particulate concentration tester, a heat flow meter, a schlieren apparatus, an atmospheric conductivity Gerdien probe, and an intelligent resistance tester; and
        the power frequency supply module and the tripping property test module each comprise: a booster transformer, a physical oscilloscope, a high-voltage power supply (HVPS) device, a digital audio collector and a point discharge portion.

2. The experimental device for tripping properties of a high-voltage transmission line in a smoldering atmosphere according to claim 1,
    wherein:
        the smoldering container is a cuboid container and opened on a top surface;
        a quartz plate serves as a bottom surface of the smoldering container;
        the flat electrical-heating plate is provided on a sidewall and the bottom surface of the smoldering container, respectively;
        the flat electrical-heating plate on the bottom surface is flush with the quartz plate;
        an edge of the smoldering container is wrapped by a steel material; and the smoldering container is provided on the high-precision electronic balance;
wherein:
a plurality of probe holes are formed on the sidewall of the smoldering container;
thermocouples are provided in the plurality of probe holes, respectively;
the infrared thermal imager, the thermocouple tree, the heat flow meter and the schlieren apparatus are arranged outside the smoldering container;
the thermocouple tree is composed of a plurality of thermocouples;
the thermocouples are fixed on a steel frame; and
the steel frame is provided outside the smoldering container; and
wherein:
a top end of the smoldering container is provided with the smoke-accumulating collection plate;
the smoke-accumulating collection plate and the sidewall of the smoldering container are made of a transparent fireproof glass material;
a periphery of the smoke-accumulating collection plate is fixedly connected with the smoldering container through an insulating fireproof glue;
a vent hole is formed in a middle of a top of the smoke-accumulating collection plate; and
a probe of the smoke-collecting analyzer is provided in the vent hole.

3. The experimental device for tripping properties of a high-voltage transmission line in a smoldering atmosphere according to claim 2, wherein:
the conductor wire is provided above the smoke-accumulating collection plate;
the conductor wire is made of an aluminum conductor steel reinforced (ACSR) strand;
the optical smoke density detector, the smoke-dust particulate concentration tester, the electrode-conductivity tester, the Ringelman smoke opacity meter and the probing smoke moisture analyzer are arranged on the conductor wire;
the smoke-dust particulate concentration tester is opposite to the vent hole;
the optical smoke density detector is sleeved on a surface of the conductor wire; and
the point discharge portion is provided above the conductor wire.

4. The experimental device for tripping properties of a high-voltage transmission line in a smoldering atmosphere according to claim 1, wherein:
the central information processor is electrically connected with the intelligent resistance tester, the physical oscilloscope, and the high-precision electronic balance, respectively;
the intelligent resistance tester is connected with the conductor wire in parallel;
the physical oscilloscope is electrically connected with a first end of the conductor wire;
a second end of the conductor wire is electrically connected with the HVPS device;
the HVPS device is electrically connected with the operating table; and
the operating table is electrically connected with the booster transformer.

5. An experimental method for tripping properties of a high-voltage transmission line in a smoldering atmosphere, comprising operating steps of:
adding a biomass fuel (BMF) to a smoldering container, testing a moisture content of the BMF through a BMF moisture meter, and testing a porosity and a density of the BMF through a high-precision porosity and density tester;
turning on a flat electrical-heating plate to heat the BMF, measuring a spatial smoke temperature with a thermocouple tree, turning on a high-precision electronic balance in a whole process to measure a mass change of the BMF during smoldering, and turning on a three-dimensional (3D) large-stroke surface contour scanner in the whole process to measure a macroscopic morphology of the BMF;
gathering continuously rising smoldering smoke together through a smoke-accumulating collection plate, collecting the smoldering smoke with an aluminum foil smoke collection bag, turning on a smoke-collecting analyzer, a high-speed camera, a high-resolution camera, an electrode-conductivity tester, an optical smoke density detector, a probing smoke moisture analyzer, a Ringelman smoke opacity meter, a smoke-dust particulate concentration tester, a heat flow meter, a schlieren apparatus, an atmospheric conductivity Gerdien probe and an intelligent resistance tester, and acquiring and analyzing characteristic parameters of a smoke field, the parameters comprising: a composition, a form, a morphology, a phase state, a density, a temperature, a humidity, a chromaticity, a particle, a flow field, a heat amount and a conductivity of the smoldering smoke;
turning on a power supply and removing the smoke-accumulating collection plate, the power supply being turned on when the smoldering smoke rises to a conductor wire, controlling a voltage and a frequency of the conductor wire through an operating table, starting a point discharge experiment, and recording and analyzing tripping properties comprising:
point discharge time, a line breakdown voltage, a leakage current, a fault recording waveform and an arc breakdown audio frequency;
respectively turning on a Fourier-transform infrared (FTIR) spectrometer and an X-ray diffractometer before and after the smoldering to measure a chemical composition and an inorganic impurity of the BMF; and
respectively adding the BMF having a different morphology and amount to the smoldering container for a repeated experiment.

\* \* \* \* \*